US010636926B1

(12) United States Patent
McGlynn et al.

(10) Patent No.: US 10,636,926 B1
(45) Date of Patent: Apr. 28, 2020

(54) DISTRIBUTED BRAGG REFLECTOR STRUCTURES IN MULTIJUNCTION SOLAR CELLS

(71) Applicant: SolAero Technologies Corp., Albuquerque, NM (US)

(72) Inventors: Daniel McGlynn, Albuquerque, NM (US); Daniel Derkacs, Albuquerque, NM (US)

(73) Assignee: SolAero Technologies Corp., Albuquerque, NM (US)

( * ) Notice: Subject to any disclaimer, the term of this patent is extended or adjusted under 35 U.S.C. 154(b) by 0 days.

(21) Appl. No.: 15/376,195

(22) Filed: Dec. 12, 2016

(51) Int. Cl.
  *H01L 31/054* (2014.01)
  *H01L 31/0687* (2012.01)
  (Continued)

(52) U.S. Cl.
  CPC ...... *H01L 31/0549* (2014.12); *H01L 31/0216* (2013.01); *H01L 31/02167* (2013.01);
  (Continued)

(58) Field of Classification Search
  CPC ........... H01L 31/0216; H01L 31/02167; H01L 31/02168; H01L 31/02327; H01L 31/03046; H01L 31/0549; H01L 31/0687; H01L 31/06875; H01L 31/0693; Y02E 10/50; Y02E 10/544
  See application file for complete search history.

(56) References Cited

U.S. PATENT DOCUMENTS

| 4,001,864 A | 1/1977 | Gibbons |
| 4,255,211 A | 3/1981 | Fraas |

(Continued)

FOREIGN PATENT DOCUMENTS

| CN | 103426965 A | 12/2013 |
| DE | 20 2012 104 415 U1 | 2/2013 |

(Continued)

OTHER PUBLICATIONS

Shvarts et al. "Multijunction solar cell with intermediate IR reflector". AIP Conf. Proc. 1477, 28-31 (2012).*

(Continued)

*Primary Examiner* — Lindsey A Bernier

(57) ABSTRACT

A multijunction solar cell and its method of fabrication, having an upper first solar subcell composed of a semiconductor material including aluminum and having a first band gap; a second solar subcell adjacent to said first solar subcell and composed of a semiconductor material having a second band gap smaller than the first band gap and being lattice matched with the upper first solar subcell; a third solar subcell adjacent to said second solar subcell and composed of a semiconductor material having a third band gap smaller than the second band gap and being lattice matched with the second solar subcell; a first and second DBR structure adjacent to the third solar subcell; and a fourth solar subcell adjacent to the DBR structures and lattice matched with said third solar subcell and composed of a semiconductor material having a fourth band gap smaller than the third band gap; wherein the fourth subcell has a direct bandgap of greater than 0.75 eV.

20 Claims, 14 Drawing Sheets

(51) Int. Cl.
   *H01L 31/0693* (2012.01)
   *H01L 31/0304* (2006.01)
   *H01L 31/18* (2006.01)
   *H01L 31/0216* (2014.01)
   *H01L 31/0232* (2014.01)

(52) U.S. Cl.
   CPC .. *H01L 31/02168* (2013.01); *H01L 31/02327* (2013.01); *H01L 31/03046* (2013.01); *H01L 31/0687* (2013.01); *H01L 31/0693* (2013.01); *H01L 31/06875* (2013.01); *H01L 31/1844* (2013.01); *Y02E 10/50* (2013.01); *Y02E 10/544* (2013.01)

(56) References Cited

U.S. PATENT DOCUMENTS

| | | |
|---|---|---|
| 4,338,480 A | 7/1982 | Antypas et al. |
| 4,612,408 A | 9/1986 | Moddel et al. |
| 5,019,177 A | 5/1991 | Wanlass |
| 5,053,083 A | 10/1991 | Sinton |
| 5,217,539 A | 6/1993 | Fraas et al. |
| 5,322,572 A | 6/1994 | Wanlass |
| 5,342,453 A | 8/1994 | Olson |
| 5,376,185 A | 12/1994 | Wanlass |
| 5,479,032 A | 12/1995 | Forrest et al. |
| 5,828,088 A | 10/1998 | Mauk |
| 5,944,913 A | 8/1999 | Hou et al. |
| 6,180,432 B1 | 1/2001 | Freeouf |
| 6,239,354 B1 | 5/2001 | Wanlass |
| 6,252,287 B1 | 6/2001 | Kurtz et al. |
| 6,281,426 B1 | 8/2001 | Olson et al. |
| 6,300,557 B1 | 10/2001 | Wanlass |
| 6,300,558 B1 | 10/2001 | Takamoto et al. |
| 6,340,788 B1 | 1/2002 | King et al. |
| 6,482,672 B1 | 11/2002 | Hoffman et al. |
| 6,618,410 B1 | 9/2003 | Fischer et al. |
| 6,660,928 B1 | 12/2003 | Patton et al. |
| 6,815,736 B2 | 11/2004 | Mascarenhas |
| 6,951,819 B2 | 10/2005 | Iles et al. |
| 7,071,407 B2 | 7/2006 | Faterni et al. |
| 7,741,146 B2 | 6/2010 | Cornfeld et al. |
| 7,767,480 B1 | 8/2010 | Pickrell et al. |
| 7,785,989 B2 | 8/2010 | Sharps et al. |
| 7,960,201 B2 | 6/2011 | Cornfeld et al. |
| 8,236,600 B2 | 8/2012 | Cornfeld |
| 8,263,853 B2 | 9/2012 | Varghese |
| 8,969,712 B2 | 3/2015 | Newman et al. |
| 9,018,521 B1 | 4/2015 | Cornfeld |
| 9,252,313 B2 | 2/2016 | Meusel et al. |
| 2001/0018924 A1 | 9/2001 | Hisamatsu et al. |
| 2002/0117675 A1 | 8/2002 | Mascarenhas |
| 2003/0089392 A1 | 5/2003 | Rohr et al. |
| 2004/0166681 A1 | 8/2004 | Iles et al. |
| 2004/0200523 A1 | 10/2004 | King et al. |
| 2005/0155641 A1 | 7/2005 | Fafard |
| 2005/0247339 A1 | 11/2005 | Barnham et al. |
| 2005/0274411 A1 | 12/2005 | King et al. |
| 2006/0021565 A1 | 2/2006 | Zahler et al. |
| 2006/0144435 A1 | 7/2006 | Wanlass |
| 2006/0162768 A1 | 7/2006 | Wanlass et al. |
| 2007/0113887 A1 | 5/2007 | Laih et al. |
| 2007/0218649 A1 | 9/2007 | Hernandez |
| 2007/0277873 A1 | 12/2007 | Cornfeld et al. |
| 2008/0029151 A1 | 2/2008 | McGlynn et al. |
| 2008/0149173 A1 | 6/2008 | Sharps |
| 2008/0163920 A1* | 7/2008 | Meusel ............ H01L 31/02168 136/246 |
| 2008/0185038 A1 | 8/2008 | Sharps |
| 2008/0245409 A1 | 10/2008 | Varghese et al. |
| 2009/0038679 A1 | 2/2009 | Varghese et al. |
| 2009/0078308 A1 | 3/2009 | Varghese et al. |
| 2009/0078309 A1 | 3/2009 | Cornfeld et al. |
| 2009/0078310 A1 | 3/2009 | Stan et al. |
| 2009/0078311 A1 | 3/2009 | Stan et al. |
| 2009/0155951 A1* | 6/2009 | Stan ................. H01L 31/03042 438/74 |
| 2009/0155952 A1 | 6/2009 | Stan et al. |
| 2009/0229658 A1 | 9/2009 | Stan et al. |
| 2009/0229662 A1 | 9/2009 | Stan et al. |
| 2009/0272430 A1 | 11/2009 | Cornfeld et al. |
| 2009/0272438 A1 | 11/2009 | Cornfeld |
| 2009/0288703 A1 | 11/2009 | Stan et al. |
| 2010/0012174 A1 | 1/2010 | Varghese et al. |
| 2010/0012175 A1 | 1/2010 | Vraghese et al. |
| 2010/0147366 A1 | 6/2010 | Stan et al. |
| 2010/0186804 A1 | 7/2010 | Cornfeld |
| 2010/0203730 A1 | 8/2010 | Cornfeld et al. |
| 2010/0206365 A1 | 8/2010 | Chumney et al. |
| 2010/0229913 A1 | 9/2010 | Cornfeld |
| 2011/0011983 A1 | 1/2011 | King et al. |
| 2014/0182667 A1* | 7/2014 | Richards ......... H01L 31/035236 136/255 |
| 2014/0190559 A1 | 7/2014 | Meusel et al. |
| 2015/0090321 A1 | 4/2015 | Cho et al. |
| 2015/0357501 A1* | 12/2015 | Derkacs ............ H01L 31/06875 136/255 |
| 2016/0181464 A1 | 6/2016 | Cornfeld |
| 2017/0200845 A1* | 7/2017 | King .................... H01L 31/056 |

FOREIGN PATENT DOCUMENTS

| | | |
|---|---|---|
| DE | 10 2012 004 734 A1 | 9/2013 |
| EP | 0658944 B1 | 4/2009 |
| FR | 2 878 076 A1 | 5/2006 |
| WO | 2004-017425 A1 | 2/2004 |
| WO | 2005-015638 A1 | 2/2005 |
| WO | 2006-072423 A1 | 7/2006 |
| WO | WO 2013/074530 A2 | 5/2013 |
| WO | WO 2013/132073 A2 | 9/2013 |

OTHER PUBLICATIONS

U.S. Appl. No. 13/872,663, filed Apr. 29, 2013, Stan et al.
U.S. Appl. No. 14/828,206, filed Aug. 17, 2015, Derkacs.
Brown et al., "Results of the Telstar Radiation Experiments," *Bell System Technical Journal*, 42, 1505-1559, 1963.
Law et al., "Future Technology Pathways of Terrestrial III-V Multijunction Solar Cells for Concentrator Photovoltaic Systems," *Solar Energy Materials and Solar Cells*, 2010; 94:1314-1318.
Marvin, Assessment of Multijunction Solar Cell Performance in Radiation Environments, Aerospace Report No. TOR-2000 (1210)-1, 2000; 90 pages.
Patel et al., "Experimental Results From Performance Improvement and Radiation Hardening of Inverted Metamorphic Multijunction Solar Cells," *IEEE Journal of Photovoltaics*, Jul. 2012; 2(3):377-381.
Tada et al., Solar Cell Radiation Handbook, Third Edition, JPL Publication 82-69, 1982; cover page, face page and Table of Contents; 7 pgs.

* cited by examiner

DISTRIBUTED BRAGG REFLECTOR STRUCTURES IN MULTIJUNCTION SOLAR CELLS

REFERENCE TO RELATED APPLICATIONS

This application is related to co-pending U.S. patent application Ser. No. 14/660,092 filed Mar. 17, 2015, which is a division of U.S. patent application Ser. No. 12/716,814 filed Mar. 3, 2010, now U.S. Pat. No. 9,018,521; which was a continuation in part of U.S. patent application Ser. No. 12/337,043 filed Dec. 17, 2008.

This application is also related to co-pending U.S. patent application Ser. No. 13/872,663 filed Apr. 29, 2013, which was also a continuation-in-part of application Ser. No. 12/337,043, filed Dec. 17, 2008.

This application is also related to U.S. patent application Ser. No. 14/828,197, filed Aug. 17, 2015.

All of the above related applications are incorporated herein by reference in their entirety.

BACKGROUND OF THE INVENTION

Field of the Invention

The present disclosure relates to solar cells and the fabrication of solar cells, and more particularly the design and specification of a lattice matched multijunction solar cells adapted for specific space missions.

Description of the Related Art

Solar power from photovoltaic cells, also called solar cells, has been predominantly provided by silicon semiconductor technology. In the past several years, however, high-volume manufacturing of III-V compound semiconductor multijunction solar cells for space applications has accelerated the development of such technology not only for use in space but also for terrestrial solar power applications. Compared to silicon, III-V compound semiconductor multijunction devices have greater energy conversion efficiencies and generally more radiation resistance, although they tend to be more complex to properly specify and manufacture. Typical commercial III-V compound semiconductor multijunction solar cells have energy efficiencies that exceed 27% under one sun, air mass 0 (AM0) illumination, whereas even the most efficient silicon technologies generally reach only about 18% efficiency under comparable conditions. The higher conversion efficiency of III-V compound semiconductor solar cells compared to silicon solar cells is in part based on the ability to achieve spectral splitting of the incident radiation through the use of a plurality of photovoltaic regions with different band gap energies, and accumulating the current from each of the regions.

In satellite and other space related applications, the size, mass and cost of a satellite power system are dependent on the power and energy conversion efficiency of the solar cells used. Putting it another way, the size of the payload and the availability of on-board services are proportional to the amount of power provided. Thus, as payloads become more sophisticated, and applications anticipated for five, ten, twenty or more years, the power-to-weight ratio and lifetime efficiency of a solar cell becomes increasingly more important, and there is increasing interest not only the amount of power provided at initial deployment, but over the entire service life of the satellite system, or in terms of a design specification, the amount of power provided at the "end of life" (EOL).

Typical III-V compound semiconductor solar cells are fabricated on a semiconductor wafer in vertical, multijunction structures or stacked sequence of solar subcells, each subcell formed with appropriate semiconductor layers and including a p-n photoactive junction. Each subcell is designed to convert photons over different spectral or wavelength bands to electrical current. After the sunlight impinges on the front of the solar cell, and photons pass through the subcells, with each subcell being designed for photons in a specific wavelength band. After passing through a subcell, the photons that are not absorbed and converted to electrical energy propagate to the next subcells, where such photons are intended to be captured and converted to electrical energy.

The energy conversion efficiency of multijunction solar cells is affected by such factors as the number of subcells, the thickness of each subcell, the composition and doping of each active layer in a subcell, and the consequential band structure, electron energy levels, conduction, and absorption of each subcell, as well as the effect of its exposure to radiation in the ambient environment over time. The identification and specification of such design parameters is a non-trivial engineering undertaking, and would vary depending upon the specific space mission and customer design requirements. Since the power output is a function of both the voltage and the current produced by a subcell, a simplistic view may seek to maximize both parameters in a subcell by increasing a constituent element, or the doping level, to achieve that effect. However, in reality, changing a material parameter that increases the voltage may result in a decrease in current, and therefore a lower power output. Such material design parameters are interdependent and interact in complex and often unpredictable ways, and for that reason are not "result effective" variables that those skilled in the art confronted with complex design specifications and practical operational considerations can easily adjust to optimize performance. Electrical properties such as the short circuit current density ($J_{sc}$), the open circuit voltage ($V_{oc}$), and the fill factor (FF), which determine the efficiency and power output of the solar cell, are affected by the slightest change in such design variables, and as noted above, to further complicate the calculus, such variables and resulting properties also vary, in a non-uniform manner, over time (i.e. during the operational life of the system).

Another important mechanical or structural consideration in the choice of semiconductor layers for a solar cell is the desirability of the adjacent layers of semiconductor materials in the solar cell, i.e. each layer of crystalline semiconductor material that is deposited and grown to form a solar subcell, have similar crystal lattice constants or parameters.

SUMMARY OF THE DISCLOSURE

Objects of the Disclosure

It is an object of the present disclosure to provide increased photoconversion efficiency in a multijunction solar cell for space applications by incorporating a plurality of distributed Bragg reflector structures between two adjacent subcells in the multijunction solar cell.

It is another object of the present disclosure to provide a multijunction solar cell in which the distributed Bragg reflector structures have different wavelength bands of reflectivity.

It is another object of the present disclosure to provide a multijunction solar cell in which the DBR structure or structures enables a transition in lattice constant between two subcells.

It is another object of the present invention to provide a lattice matched four junction solar cell incorporating a plurality of different DBR structures.

Some implementations of the present disclosure may incorporate or implement fewer of the aspects and features noted in the foregoing objects.

Features of the Invention

All ranges of numerical parameters set forth in this disclosure are to be understood to encompass any and all subranges or "intermediate generalizations" subsumed herein. For example, a stated range of "1.0 to 2.0 eV" for a band gap value should be considered to include any and all subranges beginning with a minimum value of 1.0 eV or more and ending with a maximum value of 2.0 eV or less, e.g., 1.0 to 2.0, or 1.3 to 1.4, or 1.5 to 1.9 eV.

Briefly, and in general terms, the present disclosure provides a multijunction solar cell comprising: a first and a second solar subcell each having an emitter layer and a base layer forming a photoelectric junction; a first distributed Bragg reflector (DBR) structure disposed beneath the base layer of the first solar subcell and composed of a plurality of alternating layers of different semiconductor materials with discontinuities in their respective indices of refraction and arranged so that light can enter and pass through the first solar subcell and at least a first portion of which in a first spectral wavelength range can be reflected back into the first solar subcell by the DBR structure, and a second portion of which in a second spectral wavelength range can be transmitted through the DBR structure to the second solar subcell disposed beneath the DBR structure, where the second wavelength range is greater in wavelength than the first wavelength range [wherein the half width value of reflection of the DBR structure being in a range between 250 nm to 350 nm]; and wherein the alternating first and second sublayer have a different lattice constant.

In some embodiments, the upper first subcell is composed of indium gallium aluminum phosphide, with the amount of aluminum being at least 20% by mole fraction.

In another aspect, the present disclosure provides a method of manufacturing a multijunction solar cell comprising providing a germanium substrate; growing on the germanium substrate a lattice matched sequence of layers of semiconductor material using a metal organic chemical vapor disposition process to form a plurality of subcells including one or more middle subcells and a DBR structure disposed over and lattice mismatched to the germanium substrate and an upper or top subcell disposed over and lattice matched to the last middle subcell and having a band gap in the range of 2.0 to 2.15 eV.

In another aspect, the present disclosure provides a method of fabricating a four junction solar cell comprising an upper first solar subcell composed of indium gallium aluminum phosphide and having a first band gap, a second solar subcell adjacent to said first solar subcell including an emitter layer composed of indium gallium phosphide or aluminum gallium arsenide, and a base layer composed of aluminum gallium arsenide and having a second band gap smaller than the first band gap and being lattice matched with the upper first solar subcell, a third solar subcell adjacent to said second solar subcell and composed of indium gallium arsenide and having a third band gap smaller than the second band gap and being lattice matched with the second solar subcell; a DBR structure adjacent to the third solar subcell; and a fourth solar subcell adjacent to said DBR structure and having a fourth band gap smaller than the third band gap.

In some embodiments, the fourth subcell is germanium.

In some embodiments, the fourth subcell is InGaAs, GaAsSb, InAsP, InAlAs, or SiGeSn, InGaAsN, InGaAsNSb, InGaAsNBi, InGaAsNSbBi, InGaSbN, InGaBiN, InGaSbBiN.

In some embodiments, the fourth subcell has a band gap of approximately 0.67 eV, the third subcell has a band gap of approximately 1.41 eV, the second subcell has a band gap in the range of approximately 1.65 to 1.8 eV and the upper first subcell has a band gap in the range of 2.0 to 2.2 eV.

In some embodiments, the second subcell has a band gap of approximately 1.73 eV and the upper first subcell has a band gap of approximately 2.10 eV.

In some embodiments, the upper first subcell is composed of indium gallium aluminum phosphide; the second solar subcell includes an emitter layer composed of indium gallium phosphide or aluminum gallium arsenide, and a base layer composed of aluminum gallium arsenide; the third solar subcell is composed of indium gallium arsenide; and the fourth subcell is composed of germanium.

In some embodiments, the first and second distributed Bragg reflector (DBR) structures are disposed adjacent to and between the middle and bottom solar subcells and arranged so that light can enter and pass through the middle solar subcell and at least a portion of which can be reflected back into the middle solar subcell by the DBR structures.

In some embodiments, the first and second distributed Bragg reflector (DBR) structures are disposed adjacent to and between the second and the third solar subcells and arranged so that light can enter and pass through the through the third solar subcell and at least a portion of which can be reflected back into the third solar subcell by the DBR structures.

In some embodiments, each of the distributed Bragg reflector structures are composed of a plurality of alternating layers of lattice matched materials with discontinuities in their respective indices of refraction.

In some embodiments, at least some of the layers of at least one of the distributed Bragg reflector structures is composed of a plurality of alternating layers of different lattice constant.

In some embodiments, at least some of the layers of the distributed Bragg reflector structures are composed of a plurality of alternating layers having different doping levels and/or different dopant materials.

In some embodiments, at least some of the layers of the distributed Bragg reflector structures are composed of a plurality of alternating layers of different thicknesses.

In some embodiments, the width of the first spectral wavelength range is between 50 and 100 nm.

In some embodiments, the first spectral wavelength range extends between 840 and 890 nm.

In some embodiments, the first spectral wavelength range overlaps the second wavelength range by less than 10 nm.

In some embodiments, the first and second spectral wavelength ranges correspond to the spectral absorption band of the first solar subcell.

In some embodiments, the difference in refractive indices between alternating layers is maximized in order to minimize the number of periods required to achieve a given reflectivity, and the thickness and refractive index of each period determines the stop band and its limiting wavelength.

In some embodiments, each of the distributed Bragg reflector structures are composed of a plurality of alternating layers that includes a first DBR layer composed of an n type or p type $Al_xGa_{1-x}As$ layer, and a second adjacent DBR layer disposed over the first DBR layer and composed of an n or p type $Al_yGa_{1-y}As$ layer, $0<x<1$, $0<y<1$, and where y is greater than x.

In some embodiments, additional layer(s) may be added or deleted in the cell structure without departing from the scope of the present disclosure.

Some implementations of the present disclosure may incorporate or implement fewer of the aspects and features noted in the foregoing summaries.

Additional aspects, advantages, and novel features of the present disclosure will become apparent to those skilled in the art from this disclosure, including the following detailed description as well as by practice of the disclosure. While the disclosure is described below with reference to preferred embodiments, it should be understood that the disclosure is not limited thereto. Those of ordinary skill in the art having access to the teachings herein will recognize additional applications, modifications and embodiments in other fields, which are within the scope of the disclosure as disclosed and claimed herein and with respect to which the disclosure could be of utility.

BRIEF DESCRIPTION OF THE DRAWINGS

The invention will be better and more fully appreciated by reference to the following detailed description when considered in conjunction with the accompanying drawings, wherein.

GLOSSARY OF TERMS

Figure 1A:
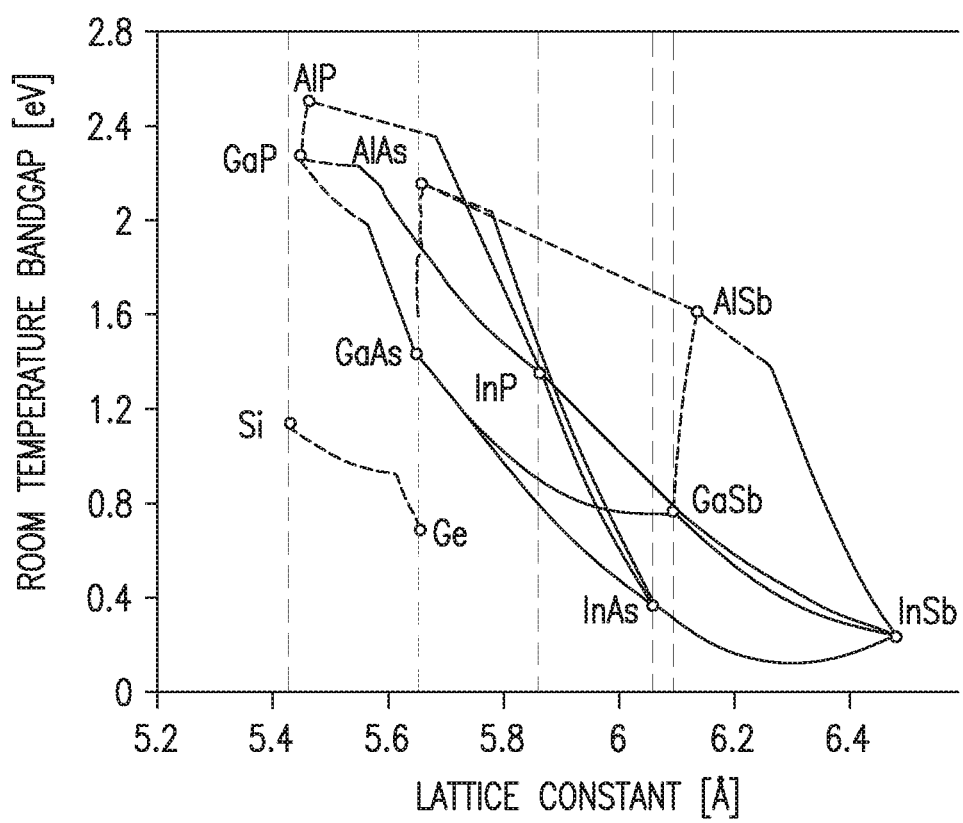
FIG. 1A is a graph representing the band gap of certain binary materials and their lattice constants.

"III-V compound semiconductor" refers to a compound semiconductor formed using at least one elements from group III of the periodic table and at least one element from group V of the periodic table. III-V compound semiconductors include binary, tertiary and quaternary compounds. Group III includes boron (B), aluminum (Al), gallium (Ga), indium (In) and thallium (T). Group V includes nitrogen (N), phosphorus (P), arsenic (As), antimony (Sb) and bismuth (Bi).

"Band gap" refers to an energy difference (e.g., in electron volts (eV)) separating the top of the valence band and the bottom of the conduction band of a semiconductor material.

"Beginning of Life (BOL)" refers to the time at which a photovoltaic power system is initially deployed in operation.

"Bottom subcell" refers to the subcell in a multijunction solar cell which is furthest from the primary light source for the solar cell.

"Compound semiconductor" refers to a semiconductor formed using two or more chemical elements.

"Current density" refers to the short circuit current density $J_{sc}$ through a solar subcell through a given planar area, or volume, of semiconductor material constituting the solar subcell.

"Deposited", with respect to a layer of semiconductor material, refers to a layer of material which is epitaxially grown over another semiconductor layer.

"End of Life (EOL)" refers to a predetermined time or times after the Beginning of Life, during which the photovoltaic power system has been deployed and has been operational. The EOL time or times may, for example, be specified by the customer as part of the required technical performance specifications of the photovoltaic power system to allow the solar cell designer to define the solar cell subcells and sublayer compositions of the solar cell to meet the technical performance requirement at the specified time or times, in addition to other design objectives. The terminology "EOL" is not meant to suggest that the photovoltaic power system is not operational or does not produce power after the EOL time.

"Graded interlayer" (or "grading interlayer")—see "metamorphic layer".

"Inverted metamorphic multijunction solar cell" or "IMM solar cell" refers to a solar cell in which the subcells are deposited or grown on a substrate in a "reverse" sequence such that the higher band gap subcells, which would normally be the "top" subcells facing the solar radiation in the final deployment configuration, are deposited or grown on a growth substrate prior to depositing or growing the lower band gap subcells.

"Layer" refers to a relatively planar sheet or thickness of semiconductor or other material. The layer may be deposited or grown, e.g., by epitaxial or other techniques.

"Lattice mismatched" refers to two adjacently disposed materials or layers (with thicknesses of greater than 100 nm) having in—plane lattice constants of the materials in their fully relaxed state differing from one another by less than 0.02% in lattice constant. (Applicant expressly adopts this definition for the purpose of this disclosure, and notes that this definition is considerably more stringent than that proposed, for example, in U.S. Pat. No. 8,962,993, which suggests less than 0.6% lattice constant difference).

"Metamorphic layer" or "graded interlayer" refers to a layer that achieves a gradual transition in lattice constant generally throughout its thickness in a semiconductor structure.

"Middle subcell" refers to a subcell in a multijunction solar cell which is neither a Top Subcell (as defined herein) nor a Bottom Subcell (as defined herein).

"Short circuit current ($I_{sc}$)" refers to the amount of electrical current through a solar cell or solar subcell when the voltage across the solar cell is zero volts, as represented and measured, for example, in units of milliamps.

"Short circuit current density"—see "current density".

"Solar cell" refers to an electronic device operable to convert the energy of light directly into electricity by the photovoltaic effect.

"Solar cell assembly" refers to two or more solar cell subassemblies interconnected electrically with one another.

"Solar cell subassembly" refers to a stacked sequence of layers including one or more solar subcells.

"Solar subcell" refers to a stacked sequence of layers including a p-n photoactive junction composed of semiconductor materials. A solar subcell is designed to convert photons over different spectral or wavelength bands to electrical current.

"Substantially current matched" refers to the short circuit current through adjacent solar subcells being substantially identical (i.e. within plus or minus 1%).

"Top subcell" or "upper subcell" refers to the subcell in a multijunction solar cell which is closest to the primary light source for the solar cell.

"ZTJ" refers to the product designation of a commercially available SolAero Technologies Corp. triple junction solar cell.

DESCRIPTION OF THE PREFERRED EMBODIMENT

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

A variety of different features of multijunction solar cells (as well as inverted metamorphic multijunction solar cells) are disclosed in the related applications noted above. Some, many or all of such features may be included in the structures and processes associated with the lattice matched or "upright" solar cells of the present disclosure. However, more particularly, the present disclosure is directed to the fabrication of a multijunction lattice matched solar cell with specific DBR structures grown between subcells.

Prior to discussing the specific embodiments of the present disclosure, a brief discussion of some of the issues associated with the design of multijunction solar cells, and the context of the composition or deposition of various specific layers in embodiments of the product as specified and defined by Applicant is in order.

There are a multitude of properties that should be considered in specifying and selecting the composition of, inter alia, a specific semiconductor layer, the back metal layer, the adhesive or bonding material, or the composition of the supporting material for mounting a solar cell thereon. For example, some of the properties that should be considered when selecting a particular layer or material are electrical properties (e.g. conductivity), optical properties (e.g., band gap, absorbance and reflectance), structural properties (e.g., thickness, strength, flexibility, Young's modulus, etc.), chemical properties (e.g., growth rates, the "sticking coefficient" or ability of one layer to adhere to another, stability of dopants and constituent materials with respect to adjacent layers and subsequent processes, etc.), thermal properties (e.g., thermal stability under temperature changes, coefficient of thermal expansion), and manufacturability (e.g., availability of materials, process complexity, process variability and tolerances, reproducibility of results over high volume, reliability and quality control issues).

In view of the trade-offs among these properties, it is not always evident that the selection of a material based on one of its characteristic properties is always or typically "the best" or "optimum" from a commercial standpoint or for Applicant's purposes. For example, theoretical studies may suggest the use of a quaternary material with a certain band gap for a particular subcell would be the optimum choice for that subcell layer based on fundamental semiconductor physics. As an example, the teachings of academic papers and related proposals for the design of very high efficiency (over 40%) solar cells may therefore suggest that a solar cell designer specify the use of a quaternary material (e.g., InGaAsP) for the active layer of a subcell. A few such devices may actually be fabricated by other researchers, efficiency measurements made, and the results published as an example of the ability of such researchers to advance the progress of science by increasing the demonstrated efficiency of a compound semiconductor multijunction solar cell. Although such experiments and publications are of "academic" interest, from the practical perspective of the Applicants in designing a compound semiconductor multijunction solar cell to be produced in high volume at reasonable cost and subject to manufacturing tolerances and variability inherent in the production processes, such an "optimum" design from an academic perspective is not necessarily the most desirable design in practice, and the teachings of such studies more likely than not point in the wrong direction and lead away from the proper design direction. Stated another way, such references may actually "teach away" from Applicant's research efforts and direction and the ultimate solar cell design proposed by the Applicants.

In view of the foregoing, it is further evident that the identification of one particular constituent element (e.g. indium, or aluminum) in a particular subcell, or the thickness, band gap, doping, or other characteristic of the incorporation of that material in a particular subcell, is not a single "result effective variable" that one skilled in the art can simply specify and incrementally adjust to a particular level and thereby increase the power output and efficiency of a solar cell.

Even when it is known that particular variables have an impact on electrical, optical, chemical, thermal or other characteristics, the nature of the impact often cannot be predicted with much accuracy, particularly when the variables interact in complex ways, leading to unexpected results and unintended consequences. Thus, significant trial and error, which may include the fabrication and evaluative testing of many prototype devices, often over a period of time of months if not years, is required to determine whether a proposed structure with layers of particular compositions, actually will operate as intended, let alone whether it can be fabricated in a reproducible high volume manner within the manufacturing tolerances and variability inherent in the production process, and necessary for the design of a commercially viable device.

Furthermore, as in the case here, where multiple variables interact in unpredictable ways, the proper choice of the combination of variables can produce new and unexpected results, and constitute an "inventive step".

The efficiency of a solar cell is not a simple linear algebraic equation as a function of the amount of gallium or aluminum or other element in a particular layer. The growth of each of the epitaxial layers of a solar cell in a reactor is a non-equilibrium thermodynamic process with dynamically changing spatial and temporal boundary conditions that is not readily or predictably modeled. The formulation and solution of the relevant simultaneous partial differential equations covering such processes are not within the ambit of those of ordinary skill in the art in the field of solar cell design.

More specifically, the present disclosure intends to provide a relatively simple and reproducible technique that does not employ inverted processing associated with inverted metamorphic multijunction solar cells, and is suitable for use in a high volume production environment in which various semiconductor layers are grown on a growth substrate in an MOCVD reactor, and subsequent processing steps are defined and selected to minimize any physical damage to the quality of the deposited layers, thereby ensuring a relatively high yield of operable solar cells meeting specifications at the conclusion of the fabrication processes.

The lattice constants and electrical properties of the layers in the semiconductor structure are preferably controlled by specification of appropriate reactor growth temperatures and times, and by use of appropriate chemical composition and dopants. The use of a deposition method, such as Molecular Beam Epitaxy (MBE), Organo Metallic Vapor Phase Epitaxy (OMVPE), Metal Organic Chemical Vapor Deposition (MOCVD), or other vapor deposition methods for the growth may enable the layers in the monolithic semiconductor structure forming the cell to be grown with the required thickness, elemental composition, dopant concentration and grading and conductivity type, and are within the scope of the present disclosure.

The present disclosure is in one embodiment directed to a growth process using a metal organic chemical vapor deposition (MOCVD) process in a standard, commercially available reactor suitable for high volume production. Other embodiments may use other growth technique, such as MBE. More particularly, regardless of the growth technique, the present disclosure is directed to the materials and fabrication steps that are particularly suitable for producing commercially viable multijunction solar cells or inverted metamorphic multijunction solar cells using commercially available equipment and established high-volume fabrication processes, as contrasted with merely academic expositions of laboratory or experimental results.

Some comments about MOCVD processes used in one embodiment are in order here.

It should be noted that the layers of a certain target composition in a semiconductor structure grown in an MOCVD process are inherently physically different than the layers of an identical target composition grown by another process, e.g. Molecular Beam Epitaxy (MBE). The material quality (i.e., morphology, stoichiometry, number and location of lattice traps, impurities, and other lattice defects) of an epitaxial layer in a semiconductor structure is different depending upon the process used to grow the layer, as well as the process parameters associated with the growth. MOCVD is inherently a chemical reaction process, while MBE is a physical deposition process. The chemicals used in the MOCVD process are present in the MOCVD reactor and interact with the wafers in the reactor, and affect the composition, doping, and other physical, optical and electrical characteristics of the material. For example, the precursor gases used in an MOCVD reactor (e.g. hydrogen) are incorporated into the resulting processed wafer material, and have certain identifiable electro-optical consequences which are more advantageous in certain specific applications of the semiconductor structure, such as in photoelectric conversion in structures designed as solar cells. Such high order effects of processing technology do result in relatively minute but actually observable differences in the material quality grown or deposited according to one process technique compared to another. Thus, devices fabricated at least in part using an MOCVD reactor or using a MOCVD process have inherent different physical material characteristics, which may have an advantageous effect over the identical target material deposited using alternative processes.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

FIG. 1A is a graph representing the band gap of certain binary materials and their lattice constants. The band gap and lattice constants of ternary materials are located on the lines drawn between typical associated binary materials (such as the ternary material AlGaAs being located between the GaAs and AlAs points on the graph, with the band gap of the ternary material lying between 1.42 eV for GaAs and 2.16 eV for AlAs depending upon the relative amount of the individual constituents). Thus, depending upon the desired band gap, the material constituents of ternary materials can be appropriately selected for growth.

Figure 1B:
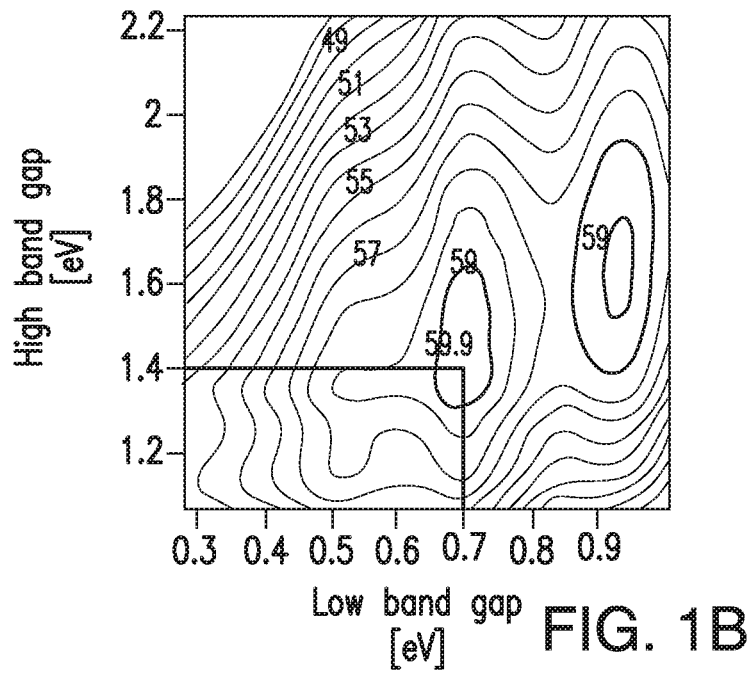
FIG. 1B is a graph representing the efficiency of two tandem subcells as a function of the band gap of the two subcells.

FIG. 1B is a graph representing the efficiency of two tandem subcells as a function of the band gap of the two subcells. In particular, it is depicted to demonstrate that the maximum efficiency of tandem combination of subcells is not a simple linear function of the band gap of either the top or high band gap subcell, or the lower or low band gap subcell.

Figure 2A:
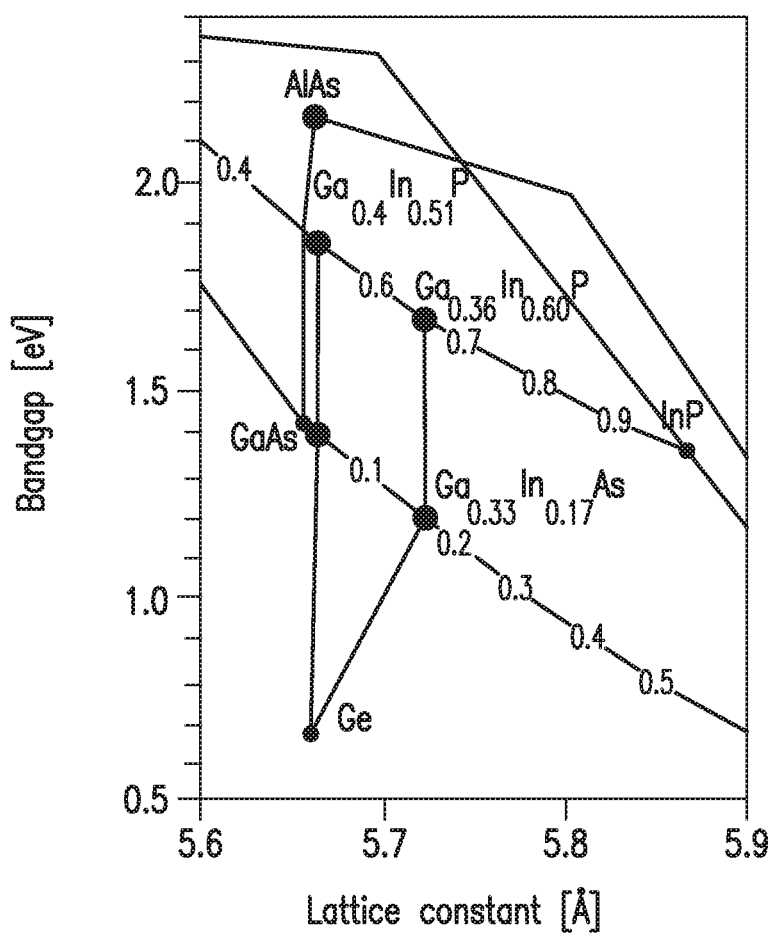
FIG. 2A is a graph of the band gap versus lattice constant of certain binary and ternary III-V semiconductors.

FIG. 2A is an enlargement of a portion of the graph of FIG. 1A illustrating different compounds of GaInAs and GaInP with different proportions of gallium and indium, and the location of specific compounds on the graph.

Figure 2B:
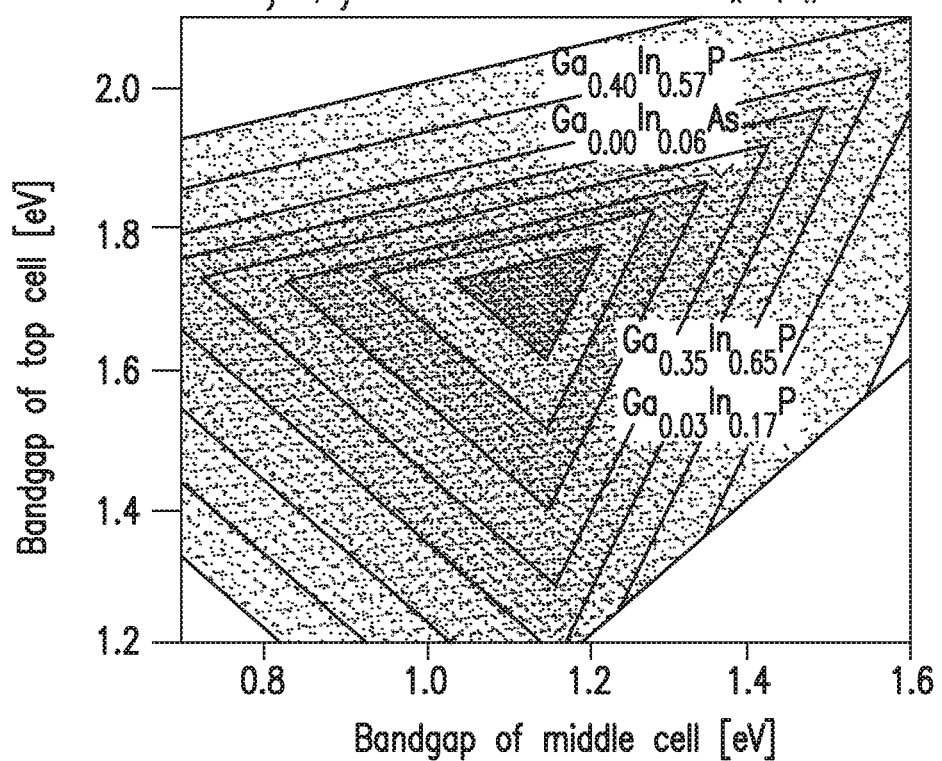
FIG. 2B is a graph of the band gap versus lattice constant of certain binary and ternary III-V semiconductors.

FIG. 2B is a representation of the theoretical efficiency of a tandem solar cell in which the band gap of the top solar subcell is plotted along the y-axis, and the band gap of the adjacent middle solar subcell is plotted along the x-axis graph, with the two ternary compounds $Ga_xIn_{1-x}As$ and $Ga_yIn_{1-y}P$ having identical lattice constants being plotted as a straight line.

Figure 3A:
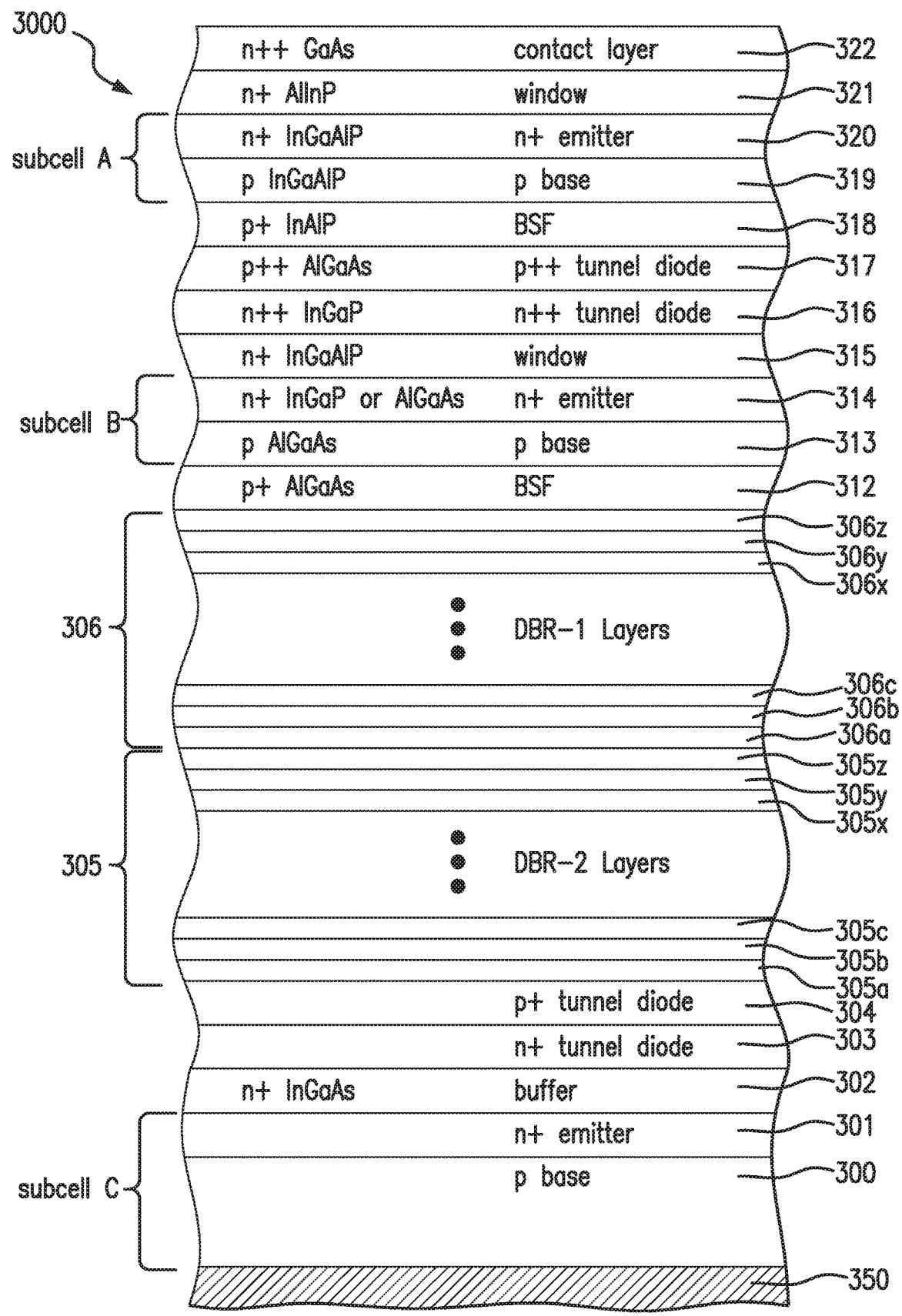
FIG. 3A is a cross-sectional view of a three junction solar cell after several stages of fabrication including the deposition of certain semiconductor layers on the growth substrate, according to a first embodiment of the present disclosure.

FIG. 3A illustrates a particular example of an embodiment of a three junction solar cell 3000 after several stages of fabrication including the growth of certain semiconductor layers on the growth substrate up to the contact layer 322 as provided by the present disclosure.

As shown in the illustrated example of FIG. 3A, the bottom subcell C includes a substrate 300 formed of p-type germanium ("Ge") which also serves as a base layer. A back metal contact pad 350 formed on the bottom of base layer 300 provides electrical contact to the multijunction solar cell 400. The bottom subcell C, further includes, for example, a highly doped n-type Ge emitter layer 301, and an n-type indium gallium arsenide ("InGaAs") nucleation layer 302. The nucleation layer is deposited over the base layer, and the emitter layer is formed in the substrate by diffusion of deposits into the Ge substrate, thereby forming the n-type Ge layer 301. Heavily doped p-type aluminum gallium arsenide ("AlGaAs") and heavily doped n-type gallium arsenide ("GaAs") tunneling junction layers 303, 304 may be deposited over the nucleation layer to provide a low resistance pathway between the bottom and middle subcells.

A first Distributed Bragg reflector (DBR) structure (DBR-2) consisting of layers 305 (specifically, individual layers 305a through 305z) are then grown adjacent to and between the tunnel diode 303, 304 of the bottom subcell C and the second solar subcell B. The DBR layers 305 are arranged so that light can enter and pass through the third solar subcell B and DBR structure 306 and at least a portion of which can be reflected back into the second solar subcell B by the DBR layers 305. In the embodiment depicted in FIG. 3A, the distributed Bragg reflector (DBR) layers 305 are specifically located between the second solar subcell B/DBR structure 306 and tunnel diode layers 304, 303; in other embodiments, the distributed Bragg reflector (DBR) layers may be located between tunnel diode layers 304/303 and buffer layer 302.

A second Distributed Bragg reflector (DBR) structure (DBR-1) consisting of layers 306 (specifically, 306a through 306z) being compositionally and optically different from DBR structure DBR-2, are then grown adjacent to and between the DBR-2 structure and the second solar subcell B. The DBR layers 306 are arranged so that light can enter and pass through the third solar subcell B and at least a portion of which can be reflected back into the third solar subcell B by the DBR layers 306. In the embodiment depicted in FIG. 3A, the distributed Bragg reflector (DBR) layers 306 are specifically located between the second solar subcell B and tunnel diode layers 304, 303; in other embodiments, the distributed Bragg reflector (DBR) layers 306 may be located between tunnel diode layers 304/303 and DBR-2 structure.

For some embodiments, distributed Bragg reflector (DBR) layers 305 and 306 can be composed of a plurality of alternating layers 305a through 305z and 306a through 306z, respectively, of lattice matched materials with discontinuities in their respective indices of refraction. For certain embodiments, the difference in refractive indices between alternating layers is maximized in order to minimize the number of periods required to achieve a given reflectivity, and the thickness and refractive index of each period determines the stop band and its limiting wavelength.

For some embodiments, distributed Bragg reflector (DBR) layers 305a through 305z, and 306a through 306z includes a first DBR layer composed of a plurality of p type $Al_xGa_{1-x}As$ layers, and a second DBR layer disposed over the first DBR layer and composed of a plurality of n or p type $Al_yGa_{1-y}As$ layers, where $0<x<1$, $0<y<1$, and y is greater than x.

The scope of the compositional and optical difference in the structures 305 and 306 will be described and specified in more detail subsequent to the discussion of other embodiments.

In the illustrated example of FIG. 3A, the subcell B includes a highly doped p-type aluminum gallium arsenide ("AlGaAs") back surface field ("BSF") layer 312, a p-type AlGaAs base layer 313, a highly doped n-type indium gallium phosphide ("InGaP") or AlGaAs emitter layer 314 and a highly doped n-type indium gallium aluminum phosphide ("InGaAlP") window layer 315. Other compositions may be used as well. The base layer 313 is formed over the BSF layer 312 after the BSF layer 312 is deposited over the DBR layers 306.

The window layer 315 helps reduce the recombination loss and improves passivation of the cell surface of the underlying junctions.

Before depositing the layers of the top cell A, heavily doped n-type InGaP and p-type AlGaAs tunneling junction layers 316, 317 may be deposited over the subcell B.

In the illustrated example, the top subcell A includes a highly doped p-type indium aluminum phosphide ("InAlP$_2$") BSF layer 318, a p-type InGaAlP base layer 319, a highly doped n-type InGaAlP emitter layer 320 and a highly doped n-type InAlP$_2$ window layer 321.

A cap or contact layer 322 of GaAs is deposited over the window layer 321 and the grid lines are formed via evaporation and lithographically patterned and deposited over the cap or contact layer 322.

Figure 3B:
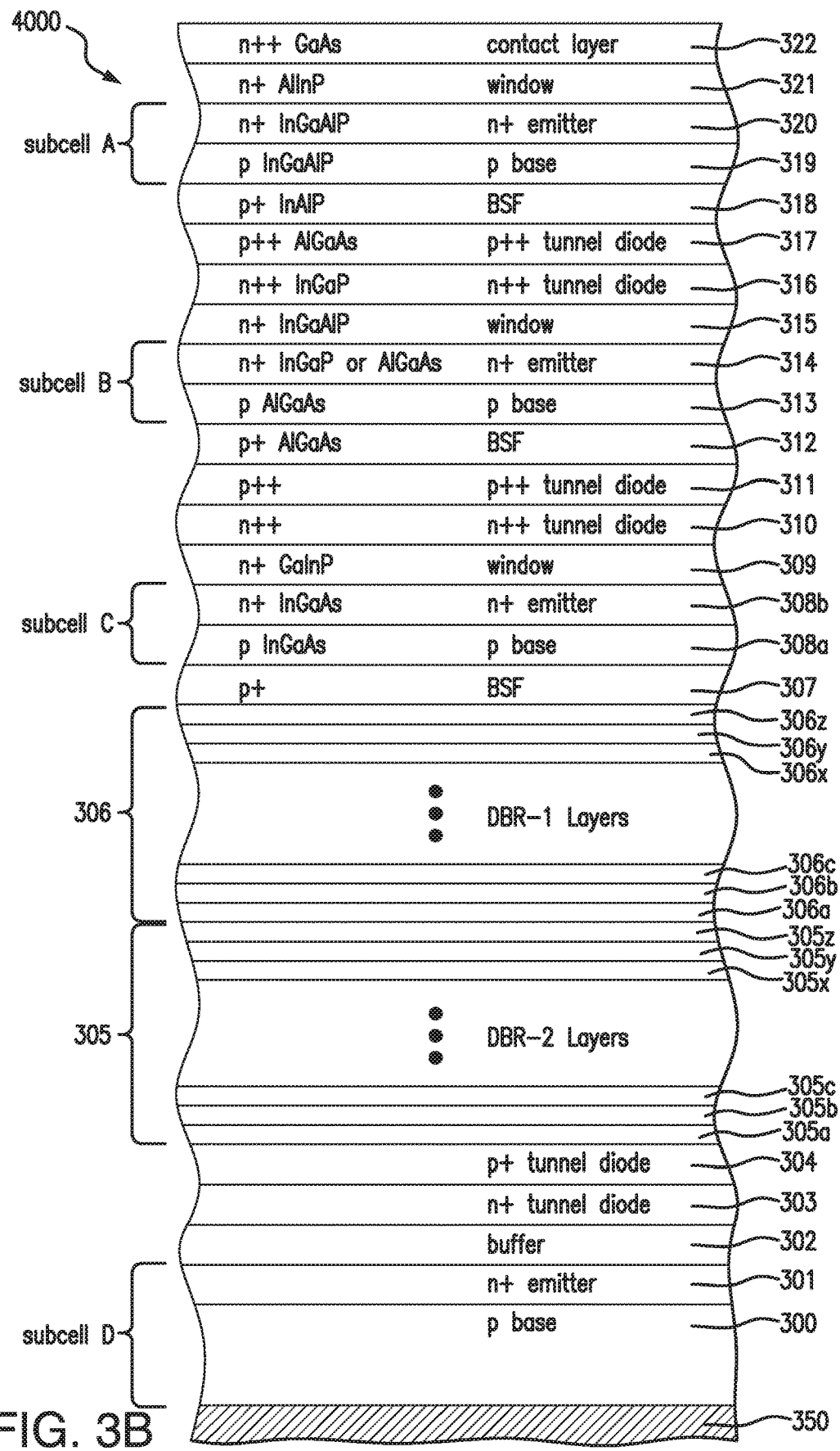
FIG. 3B is a cross-sectional view of a four junction solar cell after several stages of fabrication including the deposition of certain semiconductor layers on the growth substrate, according to a second embodiment of the present disclosure.

Turning to another embodiment of the multijunction solar cell device of the present disclosure, FIG. 3B is a cross-sectional view of an embodiment of a four junction solar cell 4000 after several stages of fabrication including the growth of certain semiconductor layers on the growth substrate up to the contact layer 322, with various layers and subcells being similar to the structure described and depicted in FIG. 3A.

The second embodiment depicted in FIG. 3B is similar to that of the first embodiment depicted in FIG. 3A except that an additional middle subcell, subcell C, including layers 307 through 311 is now included, and. since the other layers in FIG. 3B are substantially identical to that of layers in FIG. 3A, the description of such layers will not be repeated here for brevity.

In the illustrated example of FIG. 3B, the subcell C includes a highly doped p-type aluminum gallium arsenide ("AlGaAs") back surface field ("BSF") layer 307, a p-type InGaAs base layer 308a, a highly doped n-type indium gallium arsenide ("InGaAs") emitter layer 308b and a highly doped n-type indium aluminum phosphide ("AlInP$_2$") or indium gallium phosphide ("GaInP") window layer 309. The InGaAs base layer 308a of the subcell C can include, for example, approximately 1.5% In. Other compositions may be used as well. The base layer 308a is formed over the BSF layer 307 after the BSF layer 307 is deposited over the DBR layers 306.

The window layer 309 is deposited on the emitter layer 308 of the subcell C. The window layer 309 in the subcell C also helps reduce the recombination loss and improves passivation of the cell surface of the underlying junctions. Before depositing the layers of the subcell C, heavily doped n-type InGaP and p-type AlGaAs (or other suitable compositions) tunneling junction layers 310, 311 may be deposited over the subcell C.

Figure 3C:
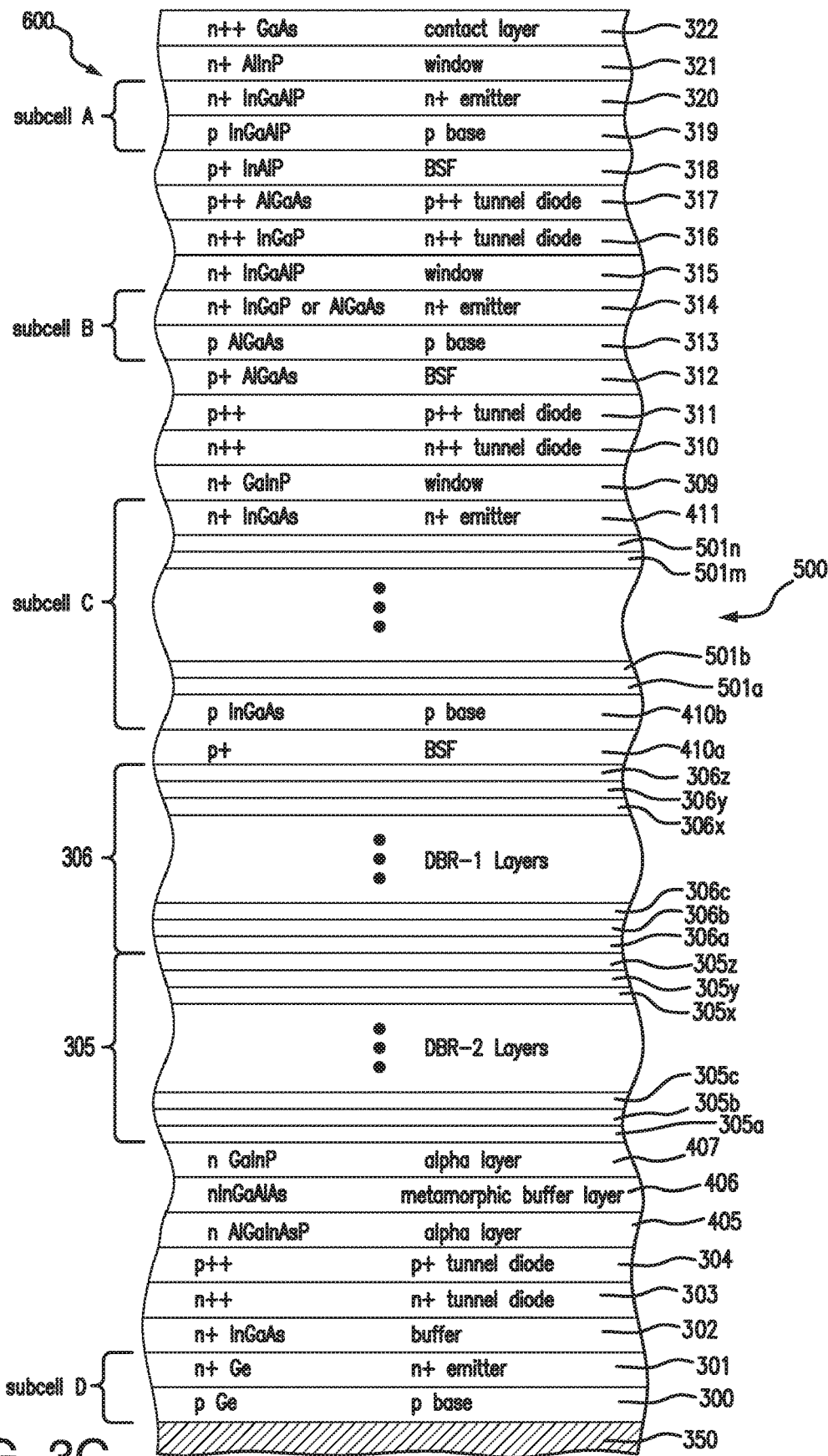
FIG. 3C is a cross-sectional view of the solar cell of a four junction solar cell after several stages of fabrication including the deposition of certain semiconductor layers on the growth substrate, according to a third embodiment of the present disclosure.

Turning to another embodiment of the multijunction solar cell device of the present disclosure, FIG. 3C is a cross-sectional view of an embodiment of a four junction solar cell 600 after several stages of fabrication including the growth of certain semiconductor layers on the growth substrate up to the contact layer 322, with various subcells being similar to the structure described and depicted in FIG. 3B.

In an embodiment of the present invention, shown in FIG. 3C, an intrinsic layer constituted by a strain-balanced multi-quantum well structure 500 is formed between base layer 410b and emitter layer 411 of middle subcell C. Metamorphic buffer layer 406 with adjacent alpha layers 405, 407, respectively, are located between DBR-2 layers 305 and p+ tunnel diode 304. The strain-balanced quantum well structure 500 includes a sequence of quantum well layers formed from alternating layers of compressively strained InGaAs and tensionally strained gallium arsenide phosphide ("GaAsP"). Strain-balanced quantum well structures are known from the paper of Chao-Gang Lou et al., Current-Enhanced Quantum Well Solar Cells, Chinese Physics Letters, Vol. 23, No. 1 (2006), and M. Mazzer et al., Progress in Quantum Well Solar Cells, Thin Solid Films, Volumes 511-512 (26 Jul. 2006). The remaining portions of the structure are the same as in the embodiment of FIG. 3B.

In an alternative example, the strain-balanced quantum well structure 500, comprising compressively strained InGaAs and tensionally strained gallium arsenide, may be provided as either the base layer 410b or the emitter layer 411.

In the illustrated example, the strain-balanced quantum well structure 500 is formed in the depletion region of the middle subcell C and has a total thickness of about 3 microns (μm) Different thicknesses may be used as well. Alternatively, as noted above, the middle subcell C can incorporate the strain-balanced quantum well structure 500 as either the base layer 410 or the emitter layer 411 without an intervening layer between the base layer 410b and emitter layer 411. A strain-balanced quantum well structure can include one or more quantum wells. The quantum wells may be formed from alternating layers of compressively strained InGaAs and tensionally strained GaAsP. An individual quantum well within the structure includes a well layer of InGaAs provided between two barrier layers of GaAsP, each having a wider energy band gap than InGaAs. The InGaAs layer is compressively strained due to its larger lattice constant with respect to the lattice constant of the substrate. The GaAsP layer is tensionally strained due to its smaller lattice constant with respect to the substrate. The "strain-balanced" condition occurs when the average strain of the quantum well structure is approximately equal to zero. Strain-balancing ensures that there is almost no stress in the quantum well structure when the multijunction solar cell layers are grown epitaxially. The absence of stress between layers can help prevent the formation of dislocations in the crystal structure, which would otherwise negatively affect device performance. For example, the compressively strained InGaAs well layers of the quantum well structure 500 may be strain-balanced by the tensile strained GaAsP barrier layers.

The quantum well structure 500 may also be lattice matched to the substrate. In other words, the quantum well structure may possess an average lattice constant that is approximately equal to a lattice constant of the substrate. In other embodiments, lattice matching the quantum well structure 500 to the substrate may further reduce the formation of dislocations and improve device performance. Alternatively, the average lattice constant of the quantum well structure 500 may be designed so that it maintains the lattice constant of the parent material in the middle subcell C. For example, the quantum well structure 500 may be fabricated to have an average lattice constant that maintains the lattice constant of the AlGaAs BSF layer 410a. In this way, dislocations are not introduced relative to the middle cell C. However, the overall device 600 is lattice mismatched if the lattice constant of the middle cell C is not matched to the substrate. The thickness and composition of each individual InGaAs or GaAsP layer within the quantum well structure 500 may be adjusted to achieve strain-balance and minimize the formation of crystal dislocations. For example, the InGaAs and GaAsP layers may be formed having respective thicknesses about 100 to 300 angstroms. Between 100 and 300 total InGaAs/GaAsP quantum wells may be formed in the strain-balanced quantum well structure 500. More or fewer quantum wells may be used as well. Additionally, the concentration of indium in the InGaAs layers may vary between 10 and 30%.

Furthermore, the quantum well structure 500 can extend the range of wavelengths absorbed by the middle subcell C. An example of approximate quantum efficiency curves for the multijunction solar cell of FIG. 3C is illustrated in FIG. 7 A. As shown in the example of FIG. 7 A, the absorption spectrum for the bottom subcell D, extends between 890-1600 nm; the absorption spectrum of the middle subcell C extends between 660-1000 nm, overlapping the absorption spectrum of the bottom subcell; and the absorption spectrum of the top subcell A, extends between 300-660 nm. Incident photons having wavelengths located within the overlapping portion of the middle and bottom subcell absorption spectrums may be absorbed by the middle subcell C prior to reaching the bottom subcell 603. As a result, the photocurrent produced by middle subcell C may increase by taking some of the current that would otherwise be excess current in the bottom subcell D. In other words, the photo-generated current density produced by the middle subcell C may increase. Depending on the total number of layers and thickness of each layer within the quantum well structure 500, the photo-generated current density of the middle subcell C may be increased to match the photo-generated current density of the bottom subcell D.

The overall current produced by the multijunction cell solar cell then may be raised by increasing the current produced by top subcell A. Additional current can be produced by top subcell A by increasing the thickness of the p-type InGaAlP2 base layer 322 in that cell. The increase in thickness allows additional photons to be absorbed, which results in additional current generation. Preferably, for space or AM0 applications, the increase in thickness of the top subcell A maintains the approximately 4 to 5% difference in current generation between the top subcell A and middle subcell C. For AM1 or terrestrial applications, the current generation of the top cell and the middle cell may be chosen to be equalized.

As a result, both the introduction of strain-balanced quantum wells in the middle subcell C and the increase in thickness of top subcell A provide an increase in overall multijunction solar cell current generation and enable an improvement in overall photon conversion efficiency. Furthermore, the increase in current may be achieved without significantly reducing the voltage across the multijunction solar cell.

In some embodiments, the sequence of first 501A and second 501B different semiconductor layers forms the base layer of the second subcell.

In some embodiments, the sequence of first and second different semiconductor layers comprises compressively strained and tensionally strained layers, respectively.

In some embodiments, an average strain of the sequence of first and second different semiconductor layers is approximately equal to zero.

In some embodiments, each of the first and second semiconductor layers is approximately 100 nm to 300 angstroms thick.

In some embodiments, the first semiconductor layer comprises InGaAs and the second semiconductor layer comprises GaAsP.

In some embodiments, a percentage of indium in each InGaAs layer is in the range of 10 to 30%.

In some embodiments, the top subcell comprises InGaP and has a thickness so that it generates approximately 4-5% less current than said first current.

Figure 4A:
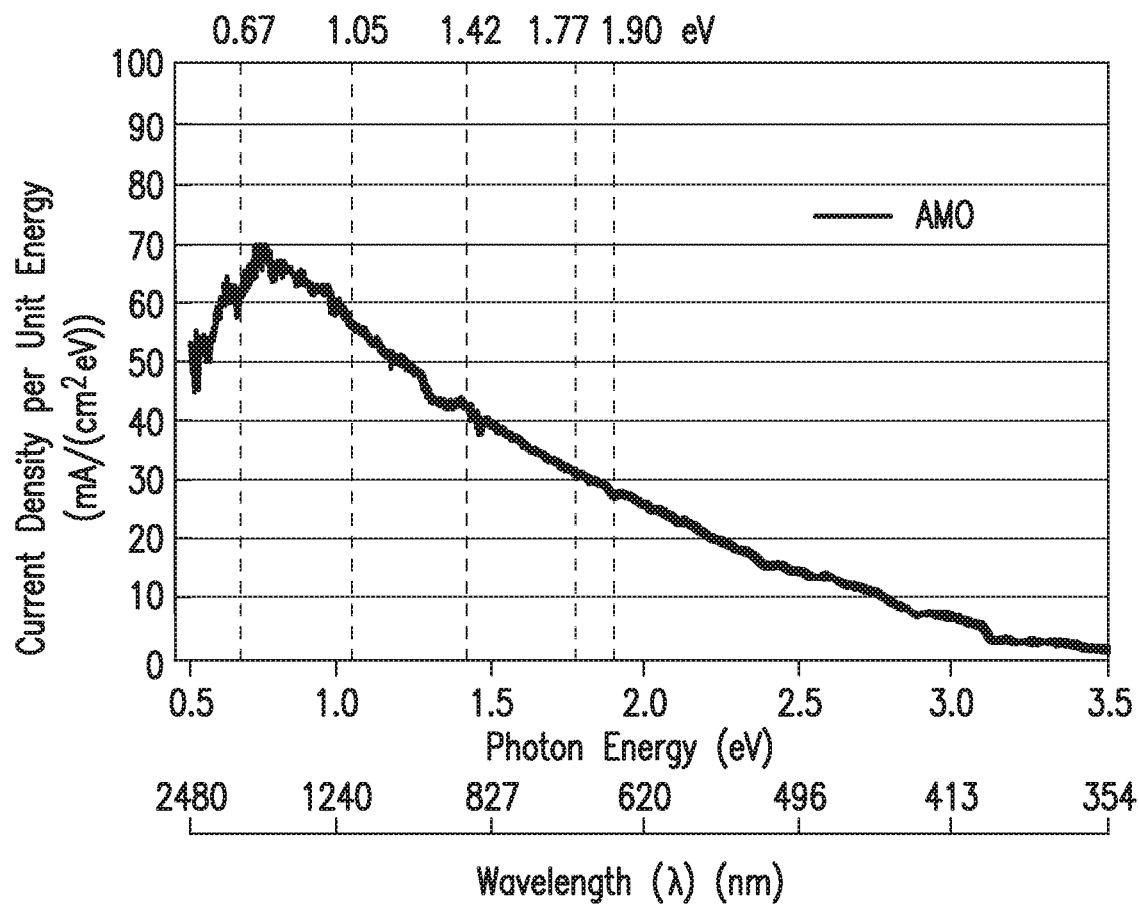
FIG. 4A is a graph of the current density per unit energy versus the photon energy of the incoming light in a solar cell.

FIG. 4A is a graph of the current density per unit energy versus the photon energy and the wavelength of the incoming light in a solar cell under the AM0 spectral environment.

Figure 4B:
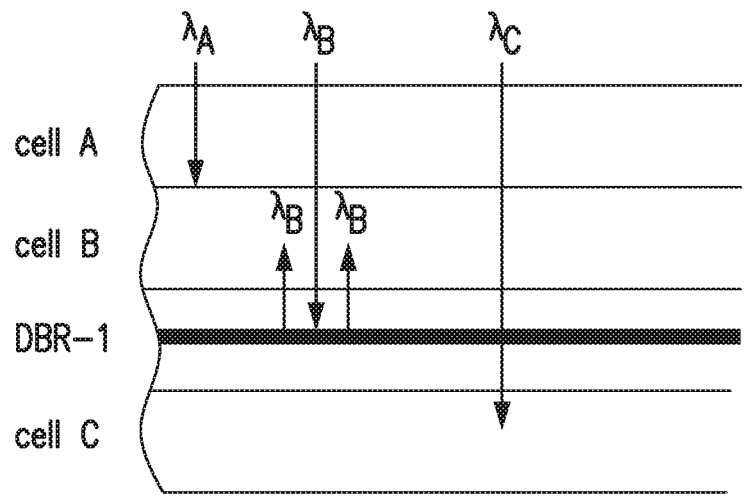
FIG. 4B is a schematic representation of photons of different wavelengths being absorbed by, or being transmitted through, different subcells in a three junction tandem solar cell with a single DBR structure.

FIG. 4B is a schematic representation of photons of different wavelengths being absorbed by, or being transmitted through, different subcells in a three junction tandem solar cell with a single DBR structure (DBR-1). In this particular representation the light wavelengths $\lambda_C > \lambda_B > \lambda_A$. The top subcell A is designed to absorb light of wavelength $\lambda_A$, the middle subcell is designed to absorb light of wavelength $\lambda_B$, and the bottom subcell is designed to absorb light of wavelength $\lambda_C$.

Figure 5A:
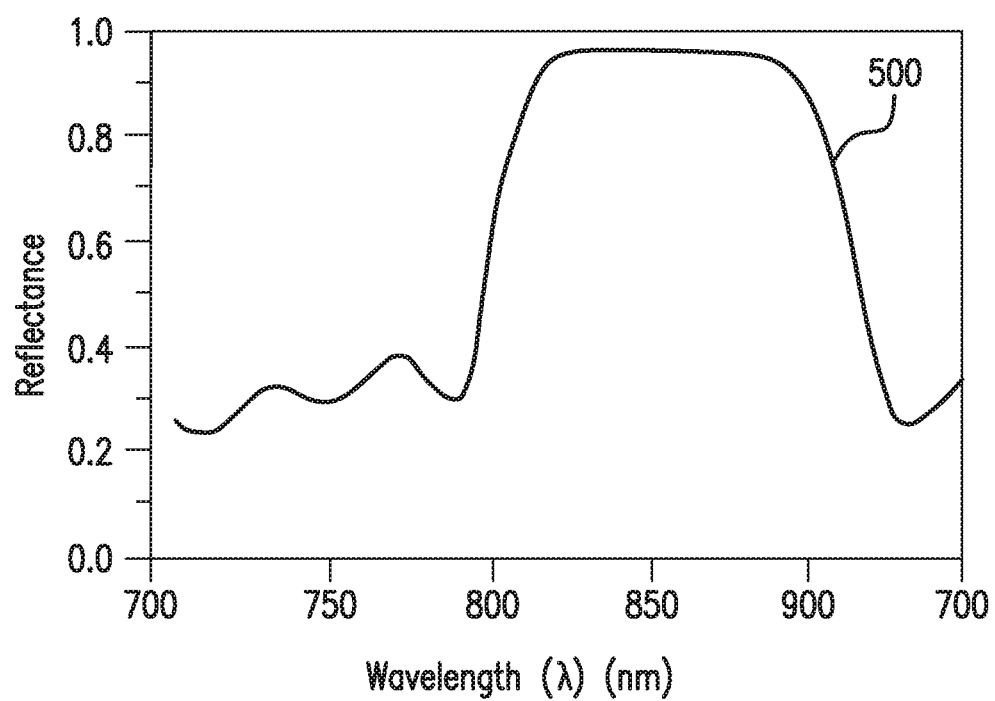
FIG. 5A is a graph of the reflectance of a single distributed Bragg reflector (DBR) structure as a function of wavelength.

FIG. 5A is a graph 500 of the reflectance of a single distributed Bragg reflector structure as a function of wavelength such as known in the prior art. In this particular example, the wavelengths of light which are most strongly reflected extend over the range 790 to 910 nm. Assuming that subcell B would absorb light in the wavelength range of 790 to 910 nm, employment of this DBR structure below subcell B will reflect any light entering the DBR structure of that wavelength back into subcell B, to allow photons of such wavelength to make a second pass through subcell B, increasing the photocurrent of subcell B.

Figure 5B:
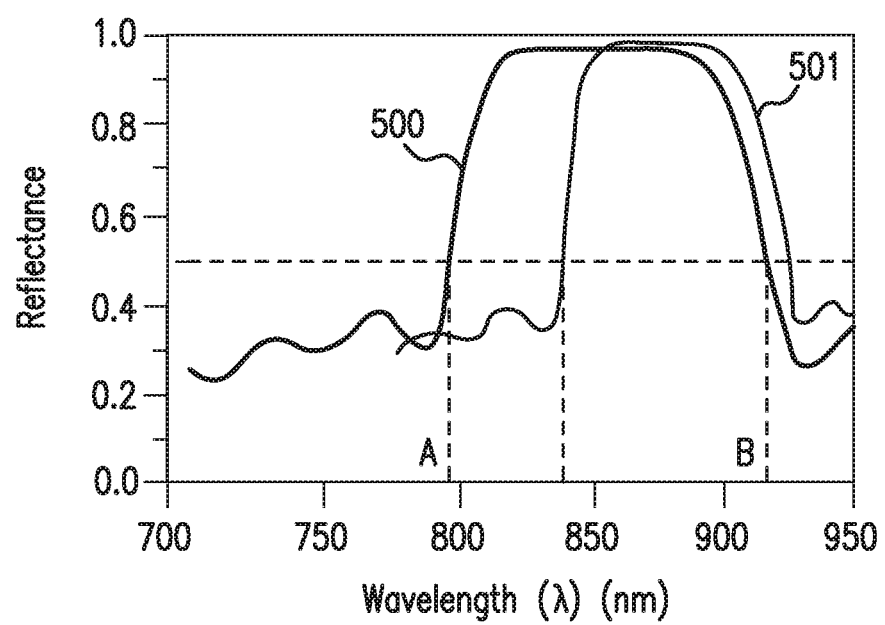
FIG. 5B is a graph of the reflectance of a first distributed Bragg reflector (DBR) structure according to the present disclosure compared with that of the structure of FIG. 5A.

FIG. 5B is a graph 501 of the reflectance of a first distributed Bragg reflector (DBR-2) structure according to the present disclosure compared with that of the graph 500 of FIG. 5A. In this particular example, the wavelengths of light which are most strongly reflected by DBR-2 extend over the range 850 to 920 nm. Assuming that subcell B would absorb light in the wavelength range of 790 to 910 nm, employment of DBR-1 below subcell B will reflect any light entering DBR-1 of wavelength range 850 to 920 nm back into subcell B to allow photons of such wavelength to make a second pass through subcell B, increasing the photocurrent of subcell B.

Figure 5C:
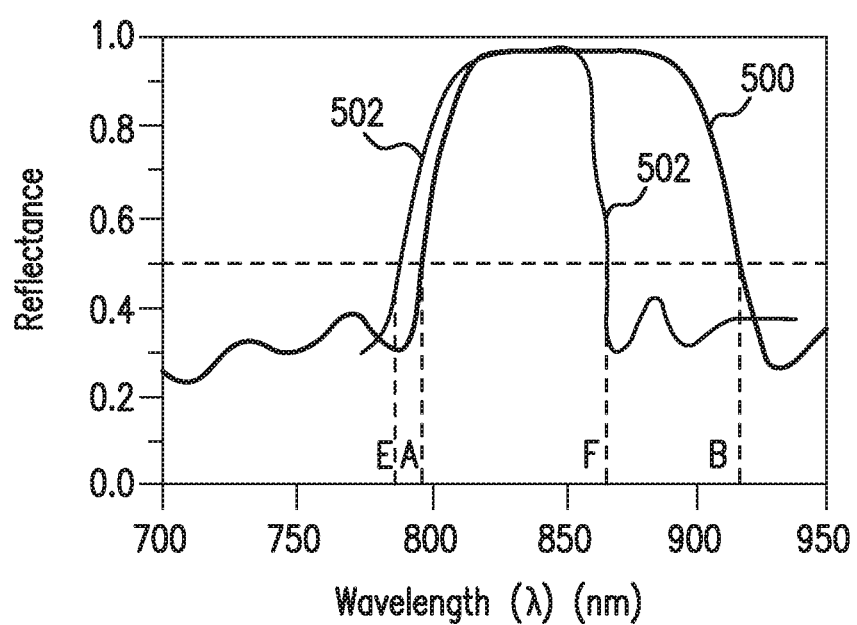
FIG. 5C is a graph of the reflectance of a first distributed Bragg reflector (DBR) structure according to the present disclosure compared with that of the structure of FIG. 5A.

FIG. 5C is a graph 502 of the reflectance of a second distributed Bragg reflector (DBR-1) structure according to the present disclosure compared with that of graph 500 of FIG. 5A. In this particular example, the wavelengths of light which are most strongly reflected extend over the range 780 to 860 nm. Assuming that subcell B would absorb light in the wavelength range of 780 to 860 nm, employment of DBR-1 below subcell B will reflect any light entering DBR-1 of that wavelength range back into subcell B to allow photons of such wavelength to make a second pass through subcell B, increasing the photocurrent of subcell B.

The present disclosure contemplates the use of both DBR-2 and DBR-1 to more finely tune or accurately cover the wavelength range to be reflected back into subcell B compared with the single DBR structure of FIG. 5A.

Figure 6:
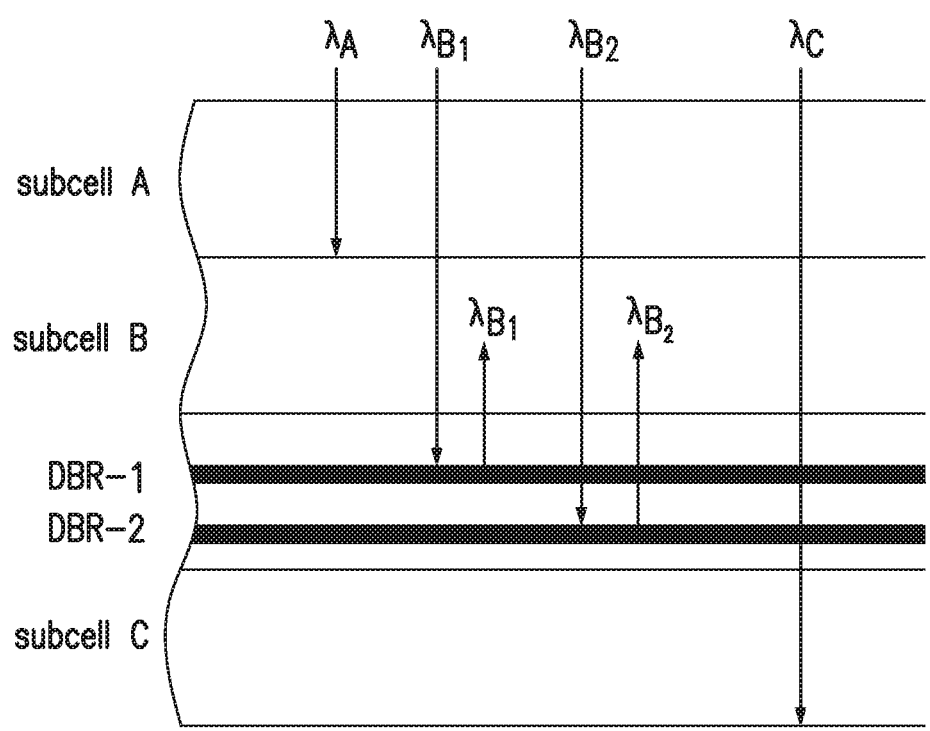
FIG. 6 is a schematic representation of photons of different wavelengths being absorbed by, or being transmitted through, different subcells in a solar cell that includes two distributed Bragg reflector (DBR) structures according to the present disclosure.

FIG. 6 is a schematic representation of photons of different wavelengths ($\lambda_A$, $\lambda_{B1}$, $\lambda_{B2}$, $\lambda_C$) being absorbed by, or being transmitted through, different subcells in a solar cell that includes two distributed Bragg reflector (DBR) structures DBR-1 and DBR-2 according to the present disclosure.

Figure 7A:
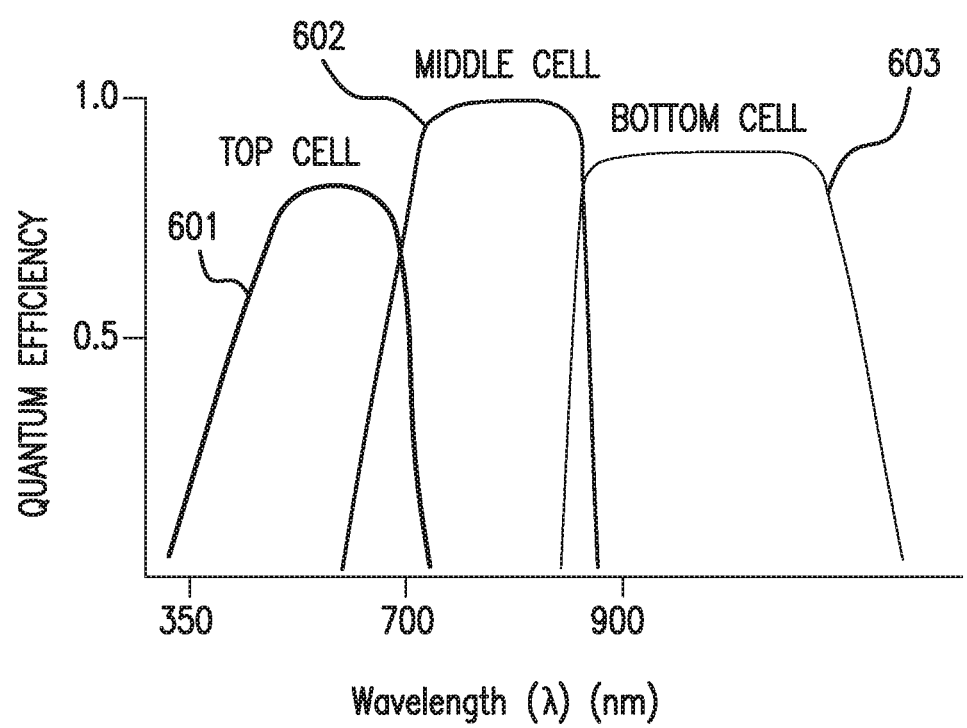
FIG. 7A is a graph of the quantum efficiency versus wavelength in a three junction solar cell.

FIG. 7A is a graph of the quantum efficiency versus wavelength in a three junction solar cell, represented by the top cell graph 601, the middle cell graph 602, and the bottom cell graph 603.

Figure 7B:
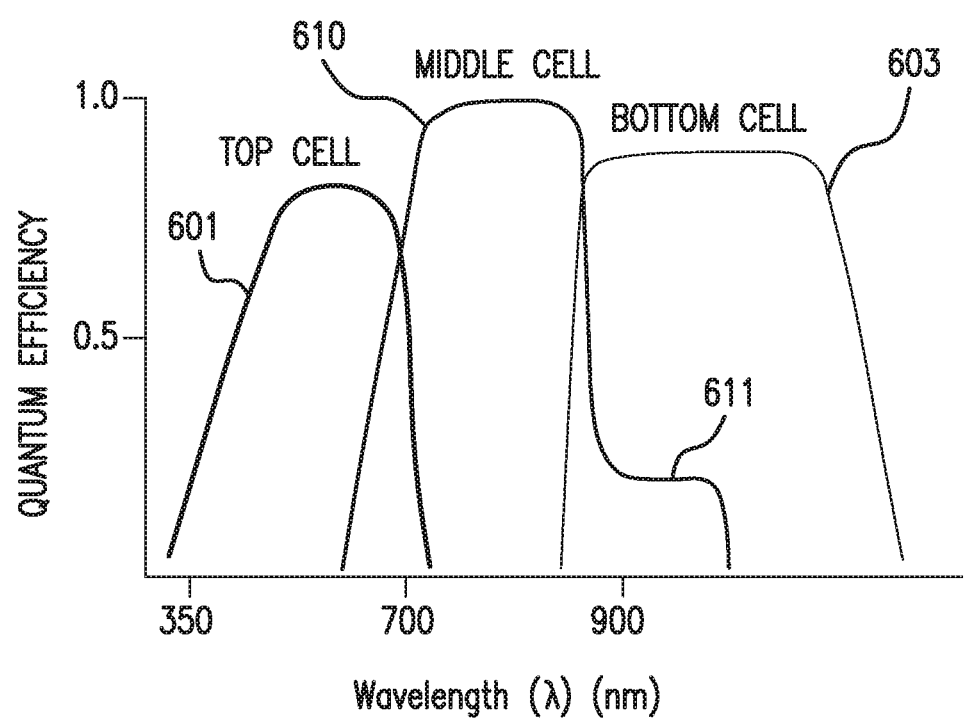
FIG. 7B is a graph of the quantum efficiency versus wavelength in a three junction solar cell after incorporation of a structure in the solar cell according to the present disclosure.

FIG. 7B is a graph of the quantum efficiency versus wavelength in a three junction solar cell after incorporation of a structure in the solar cell according to the present disclosure.

Figure 8:
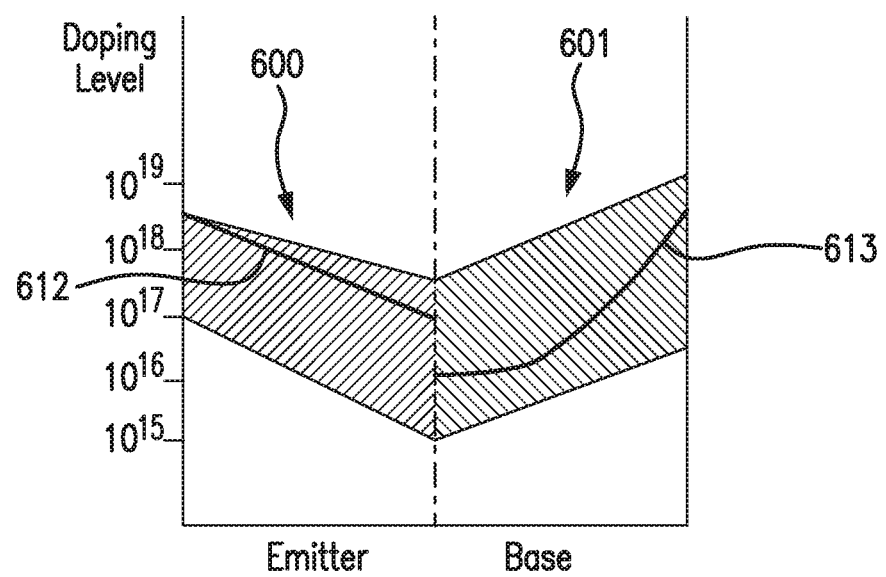
FIG. 8 is a graph of the doping profile in the base and emitter layers of a subcell in the solar cell according to the present disclosure.

FIG. 8 is a graph of the doping profile in the base and emitter layers of a subcell in the solar cell according to the present disclosure. In some embodiments, at least the base of at least one of the first A, second B or third C solar subcells has a graded doping, i.e., the level of doping varies from one surface to the other throughout the thickness of the base layer. In some embodiments, the gradation in doping is exponential. In some embodiments, the gradation in doping is incremental and monotonic.

In some embodiments, the emitter of at least one of the first A, second B or third C solar subcells also has a graded doping, i.e., the level of doping varies from one surface to the other throughout the thickness of the emitter layer. In some embodiments, the gradation in doping is linear or monotonically decreasing.

As a specific example, the doping profile of the emitter and base layers may be illustrated in FIG. 8, which depicts the amount of doping in the emitter region and the base region of a subcell. N-type dopants include silicon, selenium, sulfur, germanium or tin. P-type dopants include silicon, zinc, chromium, or germanium.

In the example of FIG. 8, the emitter doping decreases from anywhere in the range of approximately $5 \times 10^{18}$ to $1 \times 10^{17}$ free carriers per cubic centimeter in the region immediately adjacent the adjoining layer to anywhere in the range of $1 \times 10^{18}$ to $1 \times 10^{15}$ free carriers per cubic centimeter in the region adjacent to the p-n junction which is shown by the dotted line in the referenced Figure.

The base doping increases from anywhere in the range of $1 \times 10^{15}$ to $1 \times 10^{18}$ free carriers per cubic centimeter adjacent the p-n junction to anywhere in the range of $1 \times 10^{16}$ to $1 \times 10^{19}$ free carriers per cubic centimeter adjacent to the adjoining layer at the rear of the base.

In some embodiments, the doping level throughout the thickness of the base layer may be exponentially graded from the range of $1 \times 10^{16}$ free carriers per cubic centimeter to $1 \times 10^{18}$ free carriers per cubic centimeter, as represented by the curve 613 depicted in FIG. 8.

In some embodiments, the doping level throughout the thickness of the emitter layer may decline linearly from $5 \times 10^{18}$ free carriers per cubic centimeter to $5 \times 10^{17}$ free carriers per cubic centimeter as represented by the curve 612 depicted in FIG. 8.

The absolute value of the collection field generated by an exponential doping gradient $\exp[-x/\lambda]$ is given by the constant electric field of magnitude $E = kT/q(1/\lambda))(\exp[-x_b/\lambda])$, where k is the Boltzman constant, T is the absolute temperature in degrees Kelvin, q is the absolute value of electronic change, and λ is a parameter characteristic of the doping decay.

The efficacy of an embodiment of the present disclosure has been demonstrated in a test solar cell which incorporated an exponential doping profile in the three micron thick base layer of a subcell, according to one embodiment of the present disclosure. Following measurements of the electrical parameters of the test cell, there was observed a 6.7% increase in current collection. The measurements indicated an open circuit voltage ($V_{oc}$) equal to at least 3.014 volts, a short circuit current density ($J_{sc}$) of at least 16.55 mA/cm$^2$, and a fill factor (FF) of at least 0.86 at AM0.

The exponential doping profile taught by the present disclosure produces a constant field in the doped region. In the particular multijunction solar cell materials and structure of the present disclosure, the bottom subcell has the smallest short circuit current among all the subcells. Since in a multijunction solar cell, the individual subcells are stacked and form a series circuit, the total current flow in the entire solar cell is therefore limited by the smallest current produced in any of the subcells. Thus, by increasing the short circuit current in the bottom cell, the current more closely approximates that of the higher subcells, and the overall efficiency of the solar cell is increased as well. In addition to an increase in efficiency, the collection field created by the exponential doping profile will enhance the radiation hardness of the solar cell, which is important for spacecraft applications.

Although the exponentially doped profile is the doping design which has been implemented and verified, other doping profiles may give rise to a linear varying collection field which may offer yet other advantages. For example, a doping profile may be chosen to produce a linear field in the doped region which would be advantageous for both minority carrier collection and for radiation hardness at the end-of-life (EOL) of the solar cell. Such other doping profiles in one or more base layers are within the scope of the present disclosure.

The doping profile depicted herein are merely illustrative, and other more complex profiles may be utilized as would be apparent to those skilled in the art without departing from the scope of the present invention.

In some embodiments, the composition of the window layer is linearly graded so that the concentration of Al in the window layer linearly increases from the bottom surface of the window layer to the top surface of the window layer.

In some embodiments, the window layer is composed of InAlP or InGaP and the Al content at the bottom surface of the window layer is between 40.0 and 48.5% by mole fraction.

In some embodiments, the composition of the window layer is graded so that the lattice constant in the window layer is in compression at the bottom surface of the window layer, and increases to the top surface of the window layer so that the lattice constant in the window layer is in compression at the top surface.

It will be understood that each of the elements described above, or two or more together, also may find a useful application in other types of structures or constructions differing from the types of structures or constructions described above.

Although described embodiments of the present disclosure utilizes a vertical stack of three subcells, various aspects and features of the present disclosure can apply to stacks with fewer or greater number of subcells, i.e. two junction cells, three junction cells, five, six, seven junction cells, etc.

In addition, although the disclosed embodiments are configured with top and bottom electrical contacts, the subcells may alternatively be contacted by means of metal contacts to laterally conductive semiconductor layers between the subcells. Such arrangements may be used to form 3-terminal, 4-terminal, and in general, n-terminal devices. The subcells can be interconnected in circuits using these additional terminals such that most of the available photogenerated current density in each subcell can be used effectively, leading to high efficiency for the multijunction cell, notwithstanding that the photogenerated current densities are typically different in the various subcells.

As noted above, the solar cell described in the present disclosure may utilize an arrangement of one or more, or all, homojunction cells or subcells, i.e., a cell or subcell in which the p-n junction is formed between a p-type semiconductor and an n-type semiconductor both of which have the same chemical composition and the same band gap, differing only in the dopant species and types, and one or more heterojunction cells or subcells. Subcell 309, with p-type and n-type InGaP is one example of a homojunction subcell.

In some cells, a thin so-called "intrinsic layer" may be placed between the emitter layer and base layer, with the same or different composition from either the emitter or the base layer. The intrinsic layer may function to suppress minority-carrier recombination in the space-charge region. Similarly, either the base layer or the emitter layer may also be intrinsic or not-intentionally-doped ("NID") over part or all of its thickness.

The composition of the window or BSF layers may utilize other semiconductor compounds, subject to lattice constant and band gap requirements, and may include AlInP, AlAs, AlP, AlGaInP, AlGaAsP, AlGaInAs, AlGaInPAs, GaInP, GaInAs, GaInPAs, AlGaAs, AlInAs, AlInPAs, GaAsSb, AlAsSb, GaAlAsSb, AlInSb, GaInSb, AlGaInSb, AlN, GaN, InN, GaInN, AlGaInN, GaInNAs, AlGaInNAs, ZnSSe, CdSSe, and similar materials, and still fall within the spirit of the present invention.

While the solar cell described in the present disclosure has been illustrated and described as embodied in a conventional multijunction solar cell, it is not intended to be limited to the details shown, since it is also applicable to inverted metamorphic solar cells, and various modifications and structural changes may be made without departing in any way from the spirit of the present invention.

Thus, while the description of the semiconductor device described in the present disclosure has focused primarily on solar cells or photovoltaic devices, persons skilled in the art know that other optoelectronic devices, such as thermophotovoltaic (TPV) cells, photodetectors and light-emitting diodes (LEDS), are very similar in structure, physics, and materials to photovoltaic devices with some minor variations in doping and the minority carrier lifetime. For example, photodetectors can be the same materials and structures as the photovoltaic devices described above, but perhaps more lightly-doped for sensitivity rather than power production. On the other hand LEDs can also be made with similar structures and materials, but perhaps more heavily-doped to shorten recombination time, thus radiative lifetime to produce light instead of power. Therefore, this invention also applies to photodetectors and LEDs with structures, compositions of matter, articles of manufacture, and improvements as described above for photovoltaic cells.

Without further analysis, from the foregoing others can, by applying current knowledge, readily adapt the present invention for various applications. Such adaptations should and are intended to be comprehended within the meaning and range of equivalence of the following claims.

The invention claimed is:

1. A multijunction solar cell comprising:
a first solar subcell composed of indium gallium aluminum phosphide, with the amount of aluminum being at least 20% by mole fraction;
a second solar subcell comprising an emitter layer composed of indium gallium phosphide or aluminum gallium arsenide and a base layer composed of aluminum gallium arsenide;
a third solar subcell and a fourth solar subcell each having an emitter layer and a base layer forming a photoelectric junction, wherein the third solar subcell is composed of indium gallium arsenide, and wherein the fourth solar subcell is composed of germanium;
a first distributed Bragg reflector (DBR) structure disposed beneath the base layer of the third solar subcell and composed of a plurality of alternating layers of different semiconductor materials with discontinuities in their respective indices of refraction and arranged so that light can enter and pass through the third solar subcell and at least a first portion of which is light in a first spectral wavelength range of approximately 780 to 860 nm can be reflected back into the third solar subcell by the first DBR structure, and a second portion of which in a second spectral wavelength range can be transmitted through the first DBR structure to the layers disposed beneath the first DBR structure, where the second spectral wavelength range is greater in wavelength than the first spectral wavelength range;
a second distributed Bragg reflector (DBR) structure disposed beneath and adjacent the first DBR structure, such that there are not any active subcell layers between said first DBR structure and the second DBR structure, wherein the second DBR structure is compositionally different from the first DBR structure and composed of a plurality of alternating layers of different semiconductor materials with discontinuities in their respective indices of refraction and arranged so that light can enter and pass through the first DBR structure and at least a portion of which is light in the second spectral wavelength range and can be reflected back into the third solar subcell by the second DBR structure, and a second portion of which in a third spectral wavelength range can be transmitted through the second DBR structure to the fourth solar subcell disposed beneath the second DBR structure, wherein a combined structure of the first DBR structure and the adjacent second DBR structure is referred to as a combined DBR structure; and
a metamorphic layer between the second DBR structure and the fourth solar subcell,
wherein the combined DBR structure is disposed between the third solar subcell and the fourth solar subcell.

2. The multijunction solar cell as defined in claim 1, wherein the half width value of reflection of the first and second DBR structure is in a range between 250 and 350 nm.

3. The multijunction solar cell as defined in claim 1, wherein the combined DBR structure includes alternating layers of lattice mismatched materials, the combined DBR structure includes a first DBR layer composed of a plurality of n type or p type $Al_xGa_{1-x}As$ layers, and a second DBR layer disposed over the first DBR layer and composed of a plurality of n or p type $Al_yGa_{1-y}As$ layers, where $0<x<1$, $0<y<1$, and y is greater than x.

4. The multijunction solar cell as defined in claim 3, wherein the third solar subcell comprises a sequence of alternating layers of compressively strained and tensionally strained materials.

5. The multijunction solar cell as defined in claim 4, wherein an average strain of the sequence of alternating layers is approximately equal to zero.

6. The multijunction solar cell as defined in claim 4, wherein each of the layers in the sequence of alternating layers of compressively strained and tensionally strained materials is approximately 100 angstroms to 300 angstroms thick.

7. The multijunction solar cell as defined in claim 1, wherein the combined DBR structure comprises a sequence of alternating first and second different semiconductor layers, and wherein an average lattice constant of the sequence of alternating first and second semiconductor layers is approximately equal to a lattice constant of a substrate.

8. The multijunction solar cell as defined in claim 1, wherein the first spectral wavelength range overlaps the second wavelength range by less than 10 nm.

9. The multijunction solar cell as defined in claim 1, wherein the first and second spectral wavelength range corresponds to the spectral absorption band of the third solar subcell.

10. The multijunction solar cell as defined in claim 1, wherein one or more of the solar subcells have a base region in the base layer having a gradation in doping that increases exponentially from $1\times10^{15}$ free carriers per cubic centimeter adjacent the photoelectric junction to $4\times10^{18}$ free carriers per cubic centimeter adjacent to an adjoining layer at the rear of the base layer, and an emitter region in the emitter layer having a gradation in doping that decreases from approximately $5\times10^{18}$ free carriers per cubic centimeter in the region immediately adjacent an adjoining layer at the top of the emitter layer to $5\times10^{17}$ free carriers per cubic centimeter in the region adjacent to the photoelectric junction.

11. The multijunction solar cell according to claim 1, wherein the multijunction solar cell is a four junction solar cell with the fourth solar subcell having a band gap of approximately 0.67 eV, the third solar subcell above the fourth solar subcell and having a band gap of approximately 1.41 eV, the second solar subcell above the third solar subcell and having a band gap of approximately 1.73 eV and the first solar subcell above the second solar subcell and having a band gap of approximately 2.10 eV.

12. The multijunction solar cell according to claim 1, wherein the multijunction solar cell is a four junction solar cell with the fourth solar subcell having a band gap of approximately 0.67 eV, the third solar subcell above the fourth solar subcell and having a band gap of approximately 1.41 eV, the second solar subcell above the third solar subcell and having a band gap in the range of 1.65 eV to 1.8 eV and the first solar subcell above the second solar subcell and having a band gap in the range of 2.0 eV to 2.20 eV.

13. The multijunction solar cell according to claim 1, wherein the emitter layer of the second solar subcell comprises highly doped n-type indium gallium phosphide ("InGaP").

14. The multijunction solar cell according to claim 1, wherein the third solar subcell comprises a strain-balanced quantum well structure comprising a sequence of quantum well layers formed from alternating layers of compressively strained InGaAs and tensionally strained gallium arsenide phosphide.

15. The multijunction solar cell according to claim 1, wherein the third solar subcell comprises a strain-balanced quantum well structure comprising a sequence of quantum well layers formed from alternating layers of compressively strained InGaAs and tensionally strained gallium arsenide.

16. The multijunction solar cell according to claim 1, wherein the third solar subcell comprises a strain-balanced quantum well structure comprising a sequence of quantum well layers formed from alternating layers with thickness from about 100 to 300 angstroms.

17. The multijunction solar cell according to claim 1, wherein the third solar subcell comprises a highly doped n-type indium gallium arsenide emitter layer and a highly doped n-type indium aluminum phosphide or indium gallium phosphide window layer.

18. The multijunction solar cell according to claim 1, wherein the third solar subcell comprises a highly doped p-type aluminum gallium arsenide ("AlGaAs") back surface field ("BSF") layer.

19. The multijunction solar cell according to claim 1, further comprising tunnel diode layers and wherein the DBR structure is between the third solar subcell and the tunnel diode layers.

20. The multijunction solar cell according to claim 1, wherein the third solar subcell comprises a strain-balanced quantum well structure latticed matched to germanium.

* * * * *